United States Patent
Zeller et al.

(10) Patent No.: US 11,194,002 B2
(45) Date of Patent: Dec. 7, 2021

(54) OPTIMIZATION OF A CHRONOLOGICAL SEQUENCE IN AN MR CONTROL SEQUENCE

(71) Applicant: Siemens Healthcare GmbH, Erlangen (DE)

(72) Inventors: Mario Zeller, Erlangen (DE); Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/913,228

(22) Filed: Jun. 26, 2020

(65) Prior Publication Data

US 2020/0408865 A1 Dec. 31, 2020

(30) Foreign Application Priority Data

Jun. 28, 2019 (DE) .................... 102019209505.4

(51) Int. Cl.
*G01R 33/54* (2006.01)
*G01R 33/385* (2006.01)
*G01R 33/34* (2006.01)
*G01R 33/563* (2006.01)

(52) U.S. Cl.
CPC ..... *G01R 33/543* (2013.01); *G01R 33/34015* (2013.01); *G01R 33/3852* (2013.01); *G01R 33/56341* (2013.01)

(58) Field of Classification Search
USPC ........................................................ 324/307
See application file for complete search history.

(56) References Cited

U.S. PATENT DOCUMENTS

| 10,732,243 | B2* | 8/2020 | Feiweier ............... G01R 33/36 |
| 2008/0001601 | A1 | 1/2008 | Sellers et al. |
| 2008/0204179 | A1 | 8/2008 | Schuster et al. |
| 2009/0240379 | A1 | 9/2009 | Feiweier |
| 2009/0309594 | A1* | 12/2009 | Feiweier ............. G01R 33/288 |
| | | | 324/309 |
| 2013/0075068 | A1 | 3/2013 | Huber et al. |

(Continued)

FOREIGN PATENT DOCUMENTS

| DE | 102004038619 A1 | 2/2006 |
| DE | 102007030136 A1 | 1/2008 |

(Continued)

*Primary Examiner* — Rodney E Fuller
(74) *Attorney, Agent, or Firm* — Schiff Hardin LLP

(57) ABSTRACT

Method for optimizing a chronological sequence in an MR control sequence according to which a magnetic resonator having a gradient coil unit including first and second gradient coils and a cooling layer is controllable. The MR control sequence has a first and second sequence modules configured to control the first and second gradient coils, respectively. The method comprises detecting a property including a cooling power of the cooling layer for the first gradient coil or the second gradient coil, or a feature which is representative of a chronologically preceding use of the gradient coil unit; determining a first requirement of the first sequence module on the first gradient coil; determining a second requirement of the second sequence module on the second gradient coil; and optimizing the chronological sequence in the first and second sequence module by taking into account the property and the first and second requirements.

13 Claims, 3 Drawing Sheets

(56) References Cited

U.S. PATENT DOCUMENTS

| | | |
|---|---|---|
| 2018/0074141 A1 | 3/2018 | Baumgartl et al. |
| 2019/0011518 A1 | 1/2019 | Feiweier |
| 2019/0259497 A1* | 8/2019 | Zeller ................ G06Q 10/1093 |

FOREIGN PATENT DOCUMENTS

| | | |
|---|---|---|
| DE | 102007009204 A1 | 8/2008 |
| DE | 102008015261 B4 | 11/2009 |
| DE | 102011083204 A1 | 3/2013 |
| DE | 102016217420 A1 | 3/2018 |
| EP | 3425417 A1 | 1/2019 |

* cited by examiner

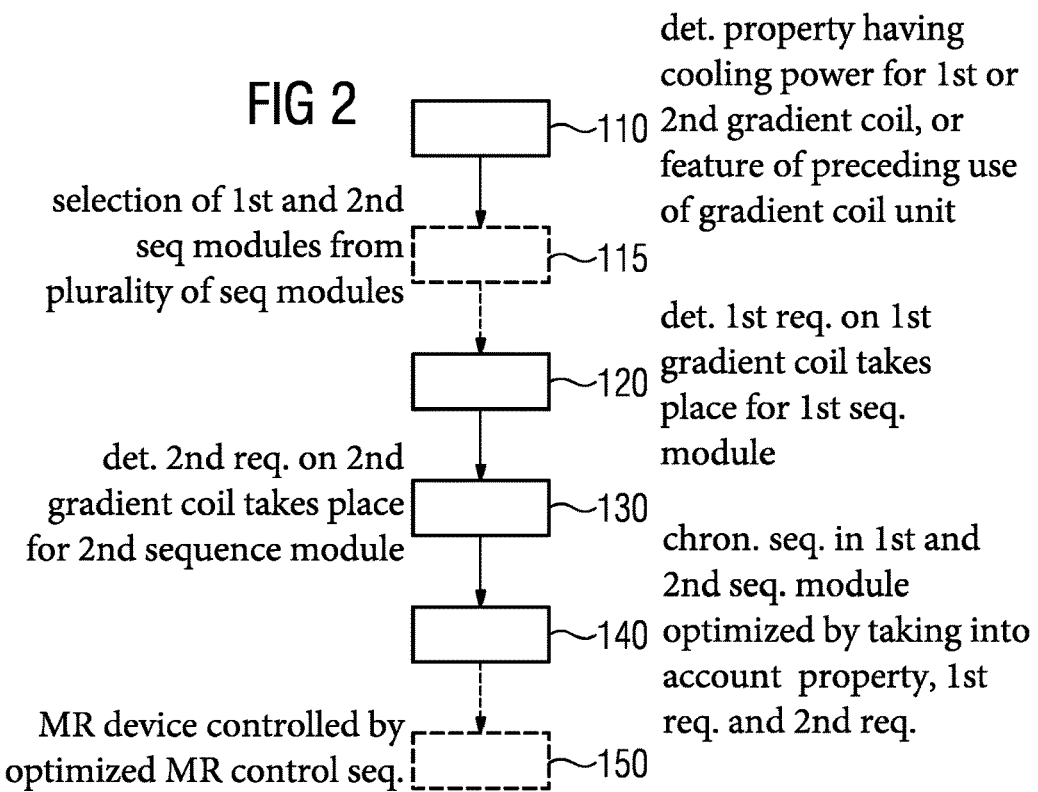
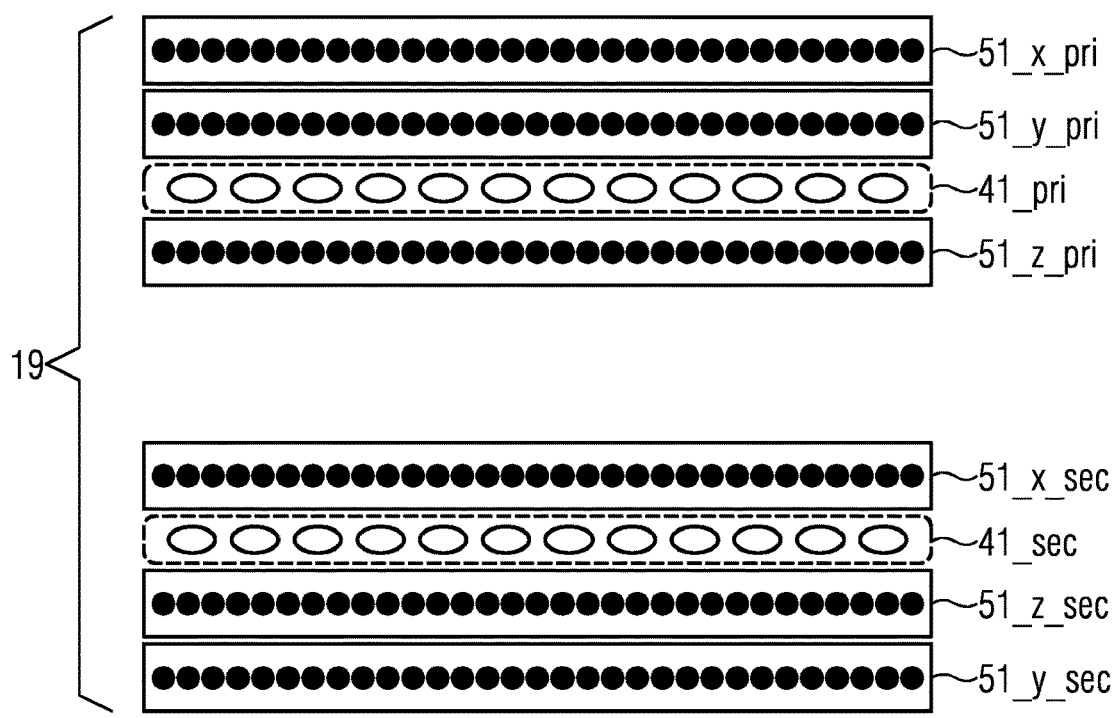

OPTIMIZATION OF A CHRONOLOGICAL SEQUENCE IN AN MR CONTROL SEQUENCE

TECHNICAL FIELD

The disclosure relates to a method, a magnetic resonance device, a computer program product and an electronically readable data carrier for optimizing a chronological sequence in an MR control sequence.

BACKGROUND

In a magnetic resonance device, the body of an examination object to be examined, particularly that of a patient, is typically exposed to a relatively strong main magnetic field of, for example, 1.5 or 3 or 7 tesla, with the aid of a main magnet. In addition, gradient pulses are applied with the aid of a gradient coil unit. By way of a radio-frequency antenna unit, by means of suitable antenna devices, radio-frequency pulses, for example excitation pulses, are then emitted, which has the effect that the nuclear spins of particular atoms excited into resonance by these radio-frequency pulses are tilted through a defined angle, known as the flip angle, relative to the magnetic field lines of the main magnetic field. When the nuclear spins are relaxed radio-frequency signals, known as magnetic resonance signals, are emitted, and are received and then further processed using suitable radio-frequency antennas. From the raw data acquired in this way, the desired image data can ultimately be reconstructed. In particular, raw data is recorded in a spatially limited cut-out of the examination object, the examination region. The image data represents the examination region graphically.

For a particular scan, a particular magnetic resonance control sequence (MR control sequence), also known as a pulse sequence, which consists of a sequence of radio-frequency pulses, for example excitation pulses and refocusing pulses, as well as gradient pulses to be transmitted suitably coordinated therewith on various gradient axes along different spatial directions, is therefore to be transmitted. Timed to coincide with this, readout windows are set which define the time periods in which the induced magnetic resonance signals are detected. In particular, the emission of the radio-frequency pulses and the gradient pulses requires an output which is fed to the magnetic resonance device and is converted into the corresponding pulses by means of the magnetic resonance device. As a result, at least one part of the magnetic resonance device is thermally loaded and the magnetic resonance device can heat up at least partially. It is typically necessary to limit the amount that the device can heat up. This can be carried out by means of cooling, for instance. DE 10 2011 083 204 A1 and DE 10 2007 009 204 A1 proposes this, for instance. In addition, MR control sequences are typically designed so that pauses occur between particular radio-frequency pulses and/or gradient pulses and/or at the end of the MR control sequence, which pauses are free of radio-frequency pulses and/or gradient pulses. In these pauses the magnetic resonance device is free of an additional significant thermal load. Similarly, temperature monitoring of at least one component is typically provided in a magnetic resonance device, wherein typically when a defined threshold value for the temperature is exceeded, a scan, in other words an execution of an MR control sequence, is interrupted and/or terminated. With increased cost pressure in public health care, the demand for short magnetic resonance examinations is of increasing importance. In some instances limitations of hardware components determine the limits for a further reduction in the recording times.

Model-based methods, such as described in DE 10 2008 015 261 B4 for instance, make far better use of the available hardware components. With model-based methods, the limiting hardware component is described by a model, as a result of which amplitudes above a reference amplitude can be used for individual gradient pulses and/or individual sequence module amplitudes. In addition, pauses for complying with long-term limitations can be determined automatically. It is therefore possible, for instance, to briefly use gradient pulses with amplitudes above the reference amplitude, if sufficiently long pauses are then complied with. EP3425417 describes a general method for optimizing a chronological sequence in an MR control sequence.

SUMMARY

An object underlying the disclosure is to specify a particularly efficient method for optimizing a chronological sequence in an MR control sequence, which enables a short time period.

The disclosed method relates to an optimization of a chronological sequence in an MR control sequence, according to which MR control sequence a magnetic resonance device can be controlled. The magnetic resonance device to be controlled according to the disclosed method comprises a gradient coil unit, which comprises a first gradient coil, a second gradient coil and at least one cooling layer. The MR control sequence, the chronological sequence of which is optimized within the scope of the disclosed method, has a first sequence module and a second sequence module, wherein the first sequence module provides control of the first gradient coil and the second sequence module provides control of the second gradient coil. The method according to the subject matter of the disclosure comprises:

a. detecting a property comprising a cooling power of the at least one cooling layer for the first gradient coil and/or the second gradient coil, and/or a feature which is representative of a chronologically preceding use of the gradient coil unit.

b. determining a first requirement of the first sequence module on the first gradient coil, c. determining a second requirement of the second sequence module on the second gradient coil, and d. optimizing the chronological sequence in at least the first sequence module and the second sequence module by taking into account the property, the first requirement and the second requirement.

An MR control sequence to be optimized, which can be referred to as original MR control sequence, is typically provided to the method. The chronological sequence in radio-frequency pulses and gradient pulses and read-out windows included in an MR control sequence is significant to image data to be reconstructed. The chronological sequence in sequence modules included in an MR control sequence is preferably variable. The original MR control sequence has an already predetermined, original sequence in at least two sequence modules. The original chronological sequence in the at least two sequence modules is to be optimized according to the method according to the disclosure. The MR control sequence can comprise the first sequence module and/or the second sequence module repeatedly.

A sequence module is typically a chronological portion of an MR control sequence, which comprises at least one gradient pulse. A sequence module typically comprises in addition at least one radio-frequency pulse and/or at least one read-out window. A chronological sequence in the radio-frequency pulses and/or gradient pulses and/or readout windows included in a sequence module is typically fixedly predetermined for the generation of image data of a particular contrast. A sequence module is preferably a per se closed portion of an MR control sequence, according to which portion a defined quantity of raw data is generated and/or recorded with a defined contrast.

The first sequence module can be embodied, for instance, to generate and/or acquire first raw data of the examination region with a first contrast. The second sequence module can be embodied, for instance, to generate and/or acquire second raw data of the examination region with a second contrast.

The first contrast is preferably different to the second contrast. A particular contrast can be generated by a sequence module comprising a diffusion weighting in a particular direction and/or with a particular b-value, for instance. A particular contrast can be generated by a sequence module effecting a suppression of a signal of a specific tissue during a recording of raw data included in the sequence module. The raw data recorded with all the sequence modules included in the MR control sequence can be reconstructed to form image data which reflects the examination region in a contrast and/or a function of the examination region, such as, for instance, a diffusion map.

The gradient coil unit comprises at least a first gradient coil for generating a magnetic field gradient in a first direction and a second gradient coil for generating a magnetic field gradient in a second direction. The first direction typically differs from the second direction. The gradient coil unit can comprise at least one further gradient coil. The first sequence module typically comprises a first gradient pulse which acts in the first direction. The first gradient coil is embodied to output the first gradient pulse. The first sequence module then provides for a control of the first gradient coil for utilizing the first gradient pulse. The first sequence module can comprise further gradient pulses. The further gradient pulses can act at least partially in the first direction and/or in a direction which differs from the first direction. Of all the gradient pulses included in the first sequence module, the first gradient pulse preferably has the largest amplitude and/or the largest rate of increase and/or the largest rate of drop and/or the longest duration. As an alternative and/or in addition, the gradient pulses included in the first sequence module can act predominantly in the first direction and/or the requirement of the gradient pulses included in the first sequence module is largest in the first direction. The first sequence module is typically embodied so that the first gradient coil is the highest stressed gradient coil of the gradient coils included in the gradient coil unit. The first sequence module is typically embodied so that the first gradient coil is loaded more highly than the second gradient coil.

The second sequence module typically comprises a second gradient pulse which acts in the second direction. The second gradient coil is embodied to output the second gradient pulse. The second sequence module then provides a control of the second gradient coil for utilizing the second gradient pulse. The second sequence module can comprise further gradient pulses. The further gradient pulses can act at least partially in the second direction and/or in a direction which differs from the second direction. Of all the gradient pulses included in the second sequence module, the second gradient pulse preferably has the largest amplitude and/or the largest rate of increase and/or the largest rate of drop and/or the longest duration. As an alternative and/or in addition, the gradient pulses included in the second sequence module can act predominantly in the second direction and/or the requirement of the gradient pulses included in the second sequence module is largest in the first direction. The second sequence module is typically embodied so that the second gradient coil is the highest stressed gradient coil of the gradient coils included in the gradient coil unit. The second sequence module is typically embodied so that the second gradient coil is loaded more highly than the first gradient coil.

One requirement of a sequence module on a gradient coil is typically an aspect which is required for utilizing the sequence module and/or an aspect and/or required ability of the gradient coil which is required for a feasibility of the MR control sequence comprising the sequence module. The first and/or second requirement can comprise an output of the first and/or second gradient coil which is required for the first and/or second sequence module. The first and/or second requirement can also comprise an output to be released to the first gradient coil within the scope of the first and/or second sequence module. The first and/or second requirement is accordingly typically a measure of the load on the first and/or second gradient coil when the first and/or second sequence module is/are utilized. The first requirement depends in particular on the first sequence module. The second requirement depends in particular on the second sequence module.

The first requirement can be determined by means of a determination unit. The determination unit is typically included in an optimization unit. An analysis of the first sequence module preferably takes place in order to determine the first requirement. For this purpose gradient pulses included in the first sequence module can be extracted and/or analyzed with respect to duration and/or amplitude. Based on the number, the time lag, the respective duration and/or the respective amplitude of the gradient pulses included in the first sequence module and acting in the first direction a requisite power, in other words the first requirement of the first sequence module on the first gradient coil, can be determined, for instance. The same may apply to the second requirement of the second sequence module. When the first requirement and/or the second requirement is/are determined, the control unit and/or the optimization unit and/or the determination unit can optionally access a database and/or storage unit, on which information can be stored. Information of this type can comprise, for instance, an association between a gradient pulse in a defined direction with a specific duration and/or a specific amplitude and a requirement on the gradient coil.

The gradient coil unit comprises at least one cooling layer. The cooling layer can be a structure enclosing a cooling medium. A cooling layer can be embodied as a tube. The cooling layer can be embodied to transport a cooling medium, such as water and/or a liquid and/or a gas, for instance. The cooling layer can be characterized in that it can reduce a temperature of the first gradient coil and/or the second gradient coil. The cooling layer can be embodied as a hollow conductor. The cooling layer can be arranged within an electrical conductor included in the first gradient coil and/or the second gradient coil.

The magnetic resonance device, in particular a determination unit included in the control unit and/or the optimization unit, and/or the optimization unit of the magnetic resonance device, can be embodied to determine the property. The property can be stored on a storage unit included in the magnetic resonance device and/or be provided to the determination unit and/or the optimization unit by a storage unit. The property can comprise a cooling power of the at least one cooling layer for the first gradient coil and/or the second gradient coil. The cooling power can be a measure of the efficiency of the cooling layer for the first gradient coil and/or the second gradient coil. The cooling power of the cooling layer for the first gradient coil and/or the second gradient coil can depend on at least one of the following factors:

e. a distance of the cooling layer from the first gradient coil and/or the second gradient coil f. a temperature of a cooling medium included in the cooling layer g. a flow speed of a cooling medium included in the cooling layer h. a cross-section of the cooling layer i. a form of the cooling layer.

One form of the cooling layer can be, for instance, an arrangement of a cooling medium comprising a cooling conductor within an electric conductor included in the first gradient coil and/or the second gradient coil. One form of the cooling layer can comprise for instance a cooling tube and/or a two-dimensional cooling apparatus.

The property can be a feature which is representative of a chronologically preceding use of the gradient coil unit, in particular of the first gradient coil and/or the second gradient coil.

Optimization of the chronological sequence in at least the first sequence module and the second sequence module typically takes place on the basis of the property, the first requirement and the second requirement. The chronological sequence in the at least two sequence modules is preferably adapted by the MR control sequence so that the optimized MR control sequence has the optimized chronological sequence in the at least two sequence modules. If the optimized chronological sequence differs from the original chronological sequence, the optimized MR control sequence typically differs from the original MR control sequence. Optimization of the chronological sequence in the MR control sequence preferably takes place by taking at least one part of the sequence modules included in the MR control sequence into account, particularly preferably by taking all sequence modules included in the MR control sequence into account. In this regard, a requirement on the component is preferably determined for each considered sequence module and is taken into account when the chronological sequence in sequence modules is optimized. With optimization of the chronological sequence in the MR control sequence, the series of at least two sequence modules is typically modified. Optimization of the chronological sequence can take place in a model-based manner and/or comprise a selection of a pause. The method for optimizing the chronological sequence in the MR control sequence can comprise a selection of the first and the second sequence module from a plurality of sequence modules included in the MR control sequence.

The disclosed method enables the thermal load to be taken into account on the basis of individual sequence modules on individual gradient coils included in the gradient coil unit. If, in addition, the cooling power for individual gradient coils is taken into account, the chronological sequence in the sequence modules, according to its requirement on the individual gradient coils and their capacitances, can be optimized in order to cope with this requirement. As an alternative or in addition to the cooling power for the individual gradient coils, their capacitance to receive a thermal load originating from the sequence modules can be determined on the basis of their chronologically preceding use. As a result, the chronological sequence in the at least two sequence modules can be optimized particularly well. In particular, the optimization can take place so that the thermal load on the gradient coil unit lies within a defined specification and pauses between sequence modules can be kept as short as possible and/or an interruption in a utilization of the optimized MR control sequence can be avoided. Under certain circumstances the duration of the required pauses between two consecutive sequence modules and/or a required pause can be reduced in this way at the end and/or after the MR control sequence has concluded. As a result, the entire duration of the MR control sequence can also be reduced. Moreover, the optimization based on the first requirement and the second requirement enables an adjustment, which is individual to the first sequence module and the second sequence module, of the chronological sequence in the MR control sequence to the magnetic resonance device which is embodied to utilize the MR control sequence in order to generate raw data. The duration of the MR control sequence can therefore be optimized with respect to the sequence modules included in the MR control sequence, the requirements of which are optimized to the gradient coil unit and the individual magnetic resonance device. An MR control sequence which is optimized by means of the disclosed method can typically be carried out by the magnetic resonance device since the property of the gradient coil unit has been taken into account. The disclosed method can be combined with known acceleration techniques such as parallel imaging, "compressed sensing" or simultaneous multilayer imaging.

One aspect of the method provides that the property comprises the cooling power of the at least one cooling layer for the first gradient coil and/or the second gradient coil according to at least one of the following features:

j. a positioning of the first gradient coil and the second gradient coil relative to one another k. a positioning of the first gradient coil relative to the at least one cooling layer l. a positioning of the second gradient coil relative to the at least one cooling layer.

The positioning of the first and/or the second gradient coil relative to the at least one cooling layer typically comprises a spatial distance between the first and/or the second gradient coil and the at least one cooling layer. On the basis of this feature, the cooling power of the cooling layer for the first and/or second gradient coil can be detected particularly accurately as a property according to the distance. As an alternative or in addition, the positioning of the first gradient coil and the second gradient coil relative to one another, in particular their distance from one another, can be considered to be a feature when the property is detected. As a result, a mutual influence of the first gradient coil and the second gradient coil between one another, in particular a mutual heating-up during operation of the gradient coil unit, can be quantified, as a result of which the cooling power can be detected particularly accurately as a property. This aspect then takes into account a spatial arrangement of the cooling layer, the first gradient coil and the second gradient coil when the cooling power is determined. Since this spatial arrangement of the cooling layer, the first gradient coil and the second gradient coil is specific to a gradient coil unit, this aspect enables an optimization of the chronological sequence in the MR control sequence which is individually attuned to the gradient coil unit integrated into the magnetic resonance device. As a result, an optimal MR control sequence attuned individually to the magnetic resonance device can be determined on the basis of any original MR control sequence.

One aspect of the method provides that the property comprises the feature which is representative of a chronologically preceding use of the gradient coil unit and the feature is embodied as the temperature of at least one component included in the magnetic resonance device.

The temperature of the component is typically an indicator of a preceding use of the gradient coil unit. In particular, the temperature of the component can be a measure of whether the magnetic resonance device is operated within its specifications and/or how much additional power output and/or thermal load is permissible on the magnetic resonance device and/or the component. The property accordingly comprises information about a future cooling power, which is available for the optimized MR control sequence during the future utilization of the MR control sequence. If, for instance, an MR control sequence with a high thermal load, such as, for instance, a diffusion sequence is selected, the magnetic resonance device can only be controlled less intensively, in other words with less additional thermal load, until cooling down. This aspect provides that based on a temperature of a component, a capacitance of the magnetic resonance device and/or the gradient coil unit for a further thermal load, it is determined which is taken into account as a property within the scope of optimizing the chronological sequence. As a result, within the scope of optimization the MR control sequence can be attuned individually to the use position of the magnetic resonance device and can be particularly short.

One aspect of the method provides that the component comprises one of the following components:

m. first and/or second gradient coil,
n. gradient amplifier for at least the first and/or second gradient coil,
o. gradient cable,
p. the at least one cooling layer
q. temperature medium of the at least one cooling layer.

These components are typically exposed to particularly high temperature changes when the magnetic resonance device is being used and/or are particularly relevant to complying with a specification of the magnetic resonance device. In particular, the temperature of the cooling layer and/or a temperature medium of the cooling layer is relevant to determining a future cooling power during the utilization of the optimized MR control sequence. As a result the chronological sequence in the sequence modules can be particularly well adjusted to current external factors. As a result, the optimized MR control sequence can be particularly short and fail-safe.

One aspect of the method provides that the property comprises the feature which is representative of a chronologically preceding use of the gradient coil unit and the detection of the property comprises providing the MR control sequence which is finally utilized by the magnetic resonance device. The temperature of the first gradient coil and/or the second gradient coil typically depends on an MR control sequence which is previously output by the magnetic resonance device. According to this aspect, the control unit and/or the optimization unit can for instance determine as a property, on the basis of at least one MR control sequence which is utilized last and/or previously by the magnetic resonance device, how high a future thermal load may be for the magnetic resonance device and/or the gradient coil unit and/or an individual gradient coil, in particular the first and/or second gradient coil when subsequently utilizing the optimized MR control sequence and how specifications of the magnetic resonance device can simultaneously be complied with. This can take place on a model basis, by, for instance, an association being provided between parameters of an MR control sequence to be utilized and/or the first and/or second sequence module and a thermal load of the first and/or second gradient coil. This association can comprise for instance a chronological averaging of an amplitude of a magnetic field gradient, in particular its root mean square. This association can also be determined on a model basis by means of the optimization unit. This aspect enables a sequence in the optimized MR control sequence which is attuned individually to a preceding use of the magnetic resonance device, as a result of which this is adjusted particularly briefly and to the current situation.

One aspect of the method provides that the property comprises the feature which is representative of a chronologically preceding use of the first gradient coil and/or the second gradient coil of the gradient coil unit. This aspect provides that in addition to the preceding use of the gradient coil unit, the preceding use of individual gradient coils is taken into account.

For instance, a TSE DIXON MR control sequence with a transversal slice direction and read-out gradient along the x-direction makes particularly high demands on the gradient coil for generating a magnetic field gradient in the x-direction, as a result of which these gradient coils and associated gradient amplifiers were exposed to a particularly high thermal load during the preceding scan. An abatement of the heating typically lasts longer than the utilization of the preceding MR control sequence, as a result of which the gradient coil for generating a magnetic field gradient in the x-direction, the first gradient coil below, should initially be loaded less significantly with the scan which follows. Optimization according to this aspect provides that the first sequence module follows the second sequence module in the optimized MR control sequence. This enables an earlier start of the optimized MR control sequence, for instance, since more time elapses for use of the first gradient coil than for use of the second gradient coil.

One aspect of the method provides that the property comprises the cooling power of the at least one cooling layer and the optimization takes place so that the gradient coil of the first and the second gradient coil, for which the cooling power of the at least one cooling layer is lower, is controlled with a lower intensity than the gradient coil of the first and the second gradient coil, for which the cooling power of the at least one cooling layer is higher. An intensity of a control of a gradient coil can be provided by the frequency and/or amplitude and/or rate of increase and/or rate of drop of the magnetic field gradients to be utilized by the gradient coil. This aspect enables particularly efficient use of the gradient coil unit, for instance with shorter pauses.

One aspect of the method provides that the first gradient coil is embodied to generate a magnetic field gradient in a first direction, the second gradient coil is embodied to generate a magnetic field gradient in a second direction, wherein the first direction differs from the second direction. The gradient coil unit preferably comprises a third gradient coil, which is embodied to generate a magnetic field gradient in a third direction. The first direction and the second direction are typically orthogonal to one another. The first direction and the third direction are typically orthogonal to one another.

One aspect of the method provides that the first gradient coil and/or the second gradient coil is described by a time constant, which time constant is greater than a duration of the first sequence module and/or the second sequence module. The duration of a sequence module typically amounts to between ten milliseconds and several hundred milliseconds. The first gradient coil and/or the second gradient coil typically have a time constant of at least one second, particularly preferably of at least one minute, as a result of which, after a thermal load by a chronologically preceding sequence module, the first gradient coil and/or the second gradient coil also typically have another significant heating-up with subsequent sequence modules on account of the chronologically preceding sequence module. This aspect allows the thermal load to be averaged over the at least two sequence modules and/or over the duration of the MR control sequence. As a result, pauses between the at least two sequence modules are shortened and/or the optimized MR control sequence can be started earlier. An optimized chronological arrangement of the sequence modules included in the MR control sequence is then particularly advantageous.

One aspect of the method provides that the first sequence module is embodied for a first diffusion weighting and the second sequence module is embodied for a second diffusion weighting.

An MR control sequence of this type can be used accordingly for diffusion imaging. With diffusion imaging, a number of items of diffusion-encoded image data is generally recorded with different diffusion weightings, i.e. with different diffusion gradient pulses and combined with one another. The strength of the diffusion weighting is defined in most cases by what is known as the diffusion weighting factor, also referred to as "b-value". A diffusion weighting can additionally be characterized by a direction, in particular a spatial direction, in which direction the diffusion weighting acts. The different diffusion-encoded image data or the diffusion-weighted image data to be combined therefrom can then be used for the desired diagnostic purposes. The first sequence module and the second sequence module then generate diffusion weightings which preferably differ from one another and which differ in the b-value and/or in the direction. A plurality of sequence modules with at least partially different diffusion weightings are typically used in the diffusion imaging. The first diffusion weighting and the second diffusion weighting preferably act in a different direction. The first diffusion weighting preferably acts in the first direction, wherein the first gradient coil is embodied to generate a magnetic field gradient in the first direction. The second diffusion weighting preferably acts in the second direction, wherein the second gradient coil is embodied to generate a magnetic field gradient in the second direction.

According to this aspect, the load of the gradient coil unit is then taken into account on the basis of a sequence module with respect to the spatial direction of the gradient pulse and the affected gradient coil. As a result, the optimization of the MR control sequence can take place in a particularly accurate and efficient manner. The duration of the MR control sequence can be shortened particularly significantly as a result. In particular, in diffusion tensor imaging sequence modules with diffusion weightings are provided in a number of different directions, as a result of which this aspect of the disclosed method is particularly effective to MR control sequences of the diffusion tensor imaging.

One aspect of the method provides that the property additionally comprises a heat output of the first gradient coil and/or the second gradient coil. Optimization of the chronological sequence in at least the first sequence module and the second sequence module takes place according to this aspect by taking into account the heat output of the first gradient coil and/or the second gradient coil. The heat output of the first gradient coil and/or the second gradient coil is a measure of a thermal load of the first gradient coil and/or the second gradient coil during its control by means of a reference gradient pulse and/or a standardized MR control sequence. The heat output of the first gradient coil and/or the second gradient coil is accordingly a measure of its reaction to a thermal load. In particular, the ohmic resistance of the first gradient coil and the second gradient coil can differ from one another, which brings about a different heat output for the first gradient coil and the second gradient coil. If the heat output is detected as an additional property for the cooling power, the efficiency of the cooling layer can be determined particularly accurately for the first gradient coil and/or the second gradient coil within the scope of optimization. According to this aspect a cooling power and/or heat output which differs for the first gradient coil and the second gradient coil can be taken into account particularly accurately.

One aspect of the method provides that the chronological sequence is optimized so that in a chronological means the first requirement and the second requirement comply with the property of the component.

One aspect of the method provides that the chronological sequence is optimized so that a duration of a part of the MR control sequence comprising the first sequence module and the second sequence module and/or an entire duration of the MR control sequence is minimized.

One aspect of the method provides that the chronological sequence is optimized so that a load of the component is constant in a chronological means on account of the first requirement and on account of the second requirement.

One aspect of the method provides that in a further method step the magnetic resonance device is controlled by means of the optimized MR control sequence.

Furthermore, the disclosure is based on a magnetic resonance device with a gradient coil unit and a control unit comprising an optimization unit. The gradient coil unit comprises a first gradient coil, a second gradient coil and at least one cooling layer. The optimization unit is embodied to carry out a disclosed method for optimizing a chronological sequence in an MR control sequence. The optimization unit typically has an input, a processor unit and an output. An MR control sequence to be optimized and/or a property can be provided to the optimization unit by way of the input. The property can comprise a cooling power of the at least one cooling layer for the first gradient coil and/or the second gradient coil, and/or a feature which is representative of a chronologically preceding use of the gradient coil unit. Further functions, algorithms or parameters required in the method can be provided to the optimization unit by way of the input. The optimization unit preferably comprises a determination unit, which determination unit is embodied to determine the first requirement and/or the second requirement. The optimization unit preferably comprises a determination unit, which determination unit is embodied to detect the property. The optimized chronological sequence in the MR control sequence and/or further results of an aspect of the disclosed method can be provided by way of the output. The optimized chronological sequence in the MR control sequence can be transmitted to the control unit, as a result of which the magnetic resonance device can be controlled according to an optimized MR control sequence comprising the optimized chronological sequence in the MR control sequence. The optimization unit can be integrated into the magnetic resonance device. The optimization unit can also be installed separately from the magnetic resonance device. The optimization unit can be connected to the magnetic resonance device.

Aspects of the disclosed magnetic resonance device are embodied similarly to the aspects of the disclosed method. The magnetic resonance device can have further control components, which are required and/or advantageous for carrying out a disclosed method. The magnetic resonance device can also be embodied to send and/or receive and/or process control signals in order to carry out a disclosed method. The optimization unit is preferably part of the control unit of the disclosed magnetic resonance device. Computer programs and further software can be stored on a storage unit of the optimization unit, by means of which the processor unit of the optimization unit controls and/or carries out a process flow of a disclosed method automatically.

A disclosed computer program product can be loaded directly into a storage unit of a programmable optimization unit and has program code means, in order to carry out a disclosed method, if the computer program product is carried out in the optimization unit. In this way, the disclosed method can be carried out rapidly, exactly reproducibly and robustly. The computer program product is configured so that it can carry out the disclosed method steps by means of the optimization unit. The optimization unit must have in each case the requirements such as for instance a corresponding working memory, a corresponding graphics card or a corresponding logic unit, so that the respective method steps can be carried out efficiently. The computer program product is saved for instance on an electronically readable medium or stored on a network or server, from where it can be loaded into the processor of a local optimization unit which can be connected directly to the magnetic resonance device or embodied as part of the magnetic resonance device. Furthermore, control information of the computer program product can be stored on an electronically readable data carrier. The control information of the electronically readable data carrier can be embodied so that they carry out a disclosed method when the data carrier is used in an optimization unit of a magnetic resonance device. Examples of electronically readable data carriers are a DVD, a magnetic tape or a USB stick, on which electronically readable control information, in particular software, is stored. If this control information (software) is read from the data carrier and stored in a control unit and/or optimization unit of a magnetic resonance device, all disclosed aspects of the previously described method can be carried out.

Furthermore, the disclosure is based on an electronically readable data carrier, on which a program is stored, which is provided to carry out a method for optimizing a chronological sequence in an MR control sequence.

The advantages of the disclosed magnetic resonance device, the disclosed computer program product and the disclosed electronically readable data carrier correspond essentially to the advantages of the disclosed method for optimizing a chronological sequence in an MR control sequence, which are embodied in detail in advance. Features, advantages or alternative aspects mentioned here can likewise also be transferred to the other claimed subject matters and vice versa.

BRIEF DESCRIPTION OF THE DRAWINGS

Further advantages, features and details of the disclosure will become apparent from the exemplary aspects described hereinbelow and with the aid of the drawings.

The drawings show:

FIG. 2 illustrates a flow diagram in accordance with aspects of the disclosure;

FIG. 3 illustrates a gradient coil unit device in accordance with aspects of the disclosure;

DETAILED DESCRIPTION

Figure 1:
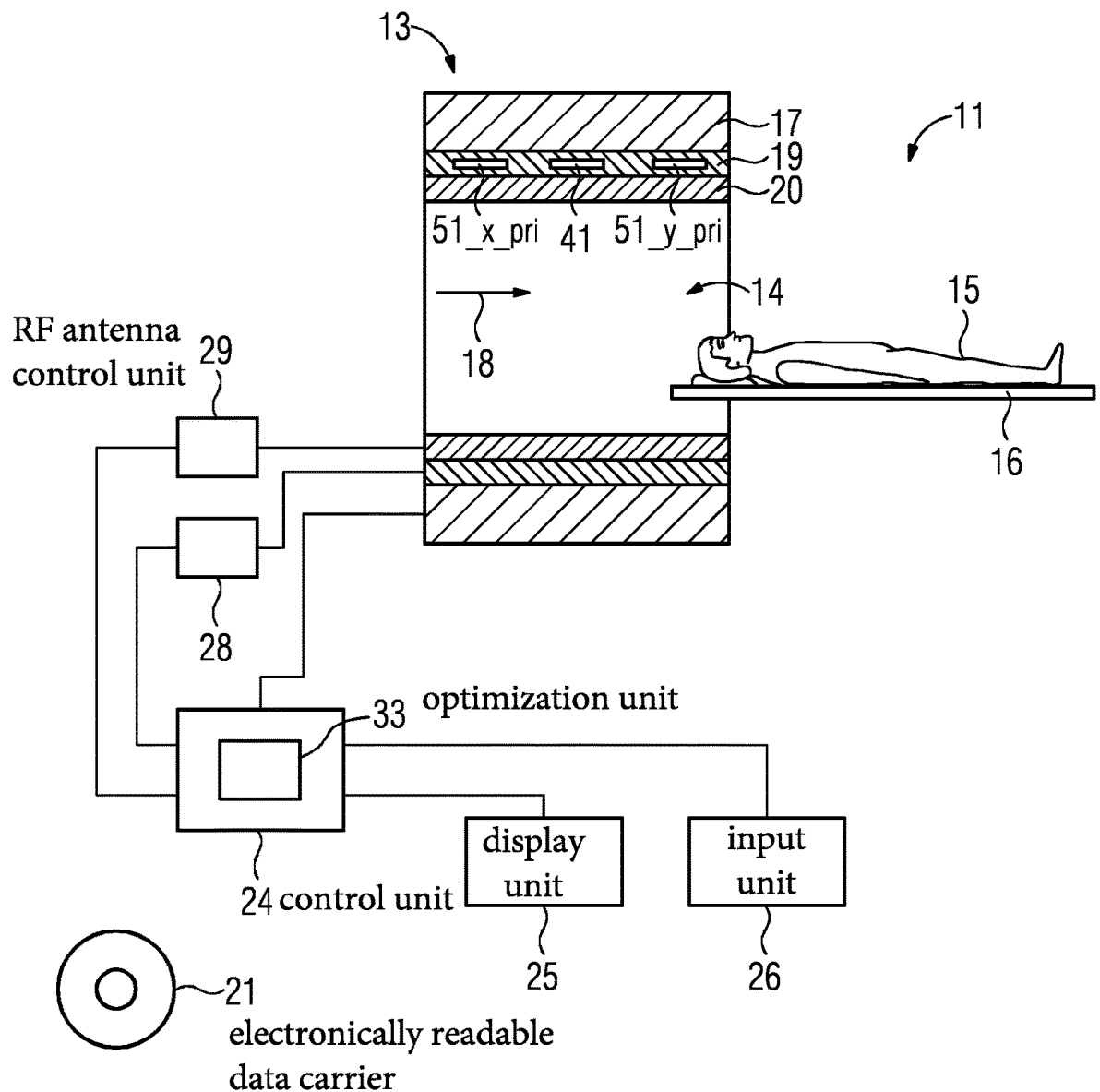
FIG. 1 illustrates a magnetic resonance device in accordance with aspects of the disclosure.

FIG. 1 shows a magnetic resonance device 11 for carrying out a disclosed method in a schematic representation. The magnetic resonance device 11 comprises a detector unit, formed by a magnet unit 13, with a main magnet 17 for generating a strong and in particular constant main magnetic field 18. Moreover, the magnetic resonance device 11 has a cylindrical patient receiving region 14 for receiving a patient 15, wherein the patient receiving region 14 is enclosed in a cylindrical manner in a peripheral direction by the magnet unit 13. The patient 15 can be moved into the patient receiving region 14 by means of a patient support apparatus 16 of the magnetic resonance device 11. To this end the patient support apparatus 16 has a patient couch, which is arranged movably within the magnetic resonance device 11.

The magnet unit 13 further has a gradient coil unit 19, which is used for spatial encoding during an imaging. The gradient coil unit 19 shown comprises a first gradient coil $51\_x\_pri$, a second gradient coil $51\_y\_pri$ and a cooling layer 41. The first gradient coil $51\_x\_pri$ and the second gradient coil $51\_y\_pri$ are embodied to generate magnetic field gradients in two directions which differ from one another. The two directions which differ from one another are preferably orthogonal to one another. The gradient coil unit 19 can also comprise a gradient amplifier and/or a gradient cable connecting the gradient amplifier to a gradient coil and/or a filter for the gradient cable.

The gradient coil unit 19 is controlled by means of a gradient control unit 28. Furthermore, the magnet unit 13 has a radio-frequency antenna unit 20, which, in the case shown, is embodied as a body coil integrated fixedly into the magnetic resonance device 11, and a radio-frequency antenna control unit 29 for exciting a polarization, which develops in the main magnetic field 18 generated by the main magnet 17. The radio-frequency antenna unit 20 is controlled by the radio-frequency antenna control unit 29 and radiates radio-frequency pulses into an examination space, which is formed essentially by the patient receiving region 14.

The magnetic resonance device 11 has a control unit 24 for controlling the main magnet 17, the gradient control unit 28 and the radio-frequency antenna control unit 29. The control unit 24 controls the magnetic resonance device 11 centrally, such as for instance the implementation of MR control sequences. Moreover, the control unit 24 comprises a reconstruction unit (not shown in more detail) for reconstructing medical image data, which is detected during the magnetic resonance examination. The magnetic resonance device 11 has a display unit 25. Control information such as, for instance, control parameters and reconstructed image data can be indicated on the display unit 25, for instance on at least one monitor, for a user. Moreover, the magnetic resonance device 11 has an input unit 26, by means of which information and/or control parameters can be entered by a user during a scan procedure. The control unit 24 can comprise the gradient control unit 28 and/or radio-frequency antenna control unit 29 and/or the display unit 25 and/or the input unit 26.

The control unit 24 further comprises an optimization unit 33. The optimization unit 33 is moreover designed to carry out a method for optimizing a chronological sequence in an MR control sequence. To this end, the optimization unit 33 has computer programs and/or software, which can be directly loaded into a storage unit, not shown in further detail, of the optimization unit 33, having program means in order to carry out a method for optimizing a chronological sequence in an MR control sequence, if the computer programs and/or software are carried out in the optimization unit 33. The optimization unit 33 to this end has a processor, not shown in more detail, which is designed to execute the computer programs and/or software. Alternatively to this, the computer programs and/or software can also be stored on an electronically readable data carrier 21 which is embodied separately from the control unit 24 and/or optimization unit 33, wherein data access from the optimization unit 33 to the electronically readable data carrier 21 can take place via a data network.

The magnetic resonance device 11 shown can naturally comprise further components which magnetic resonance devices 11 usually have. A general mode of operation of a magnetic resonance device 11 is moreover known to the person skilled in the art so that a detailed description of the further components is not included. The magnetic resonance device 11 is therefore designed together with the optimization unit 33 in order to carry out a disclosed method.

A method for optimizing a chronological sequence in an MR control sequence can also exist in the form of a computer program product, which implements the method on the optimization unit 33 if it is carried out on the optimization unit 33. An electronically readable data carrier 21 with electronically readable control information stored thereon can also be provided, said control information comprising a computer program product such as just described and being configured, on use of the data carrier 21 in an optimization unit 33 of a magnetic resonance device 11, to carry out the method described.

FIG. 2 shows a flow diagram of an aspect of a disclosed method. An MR control sequence to be optimized is typically present at the start of the method. The MR control sequence to be optimized is typically present here in an original version, which original MR control sequence is not adjusted to the magnetic resonance device 11 and/or the gradient coil unit 19 and/or a specific measurement and/or the examination object. According to the optimized MR control sequence and/or with the original MR control sequence, the magnetic resonance device 11 can be controlled. The original MR control sequence comprises at least two sequence modules $M1\_x$, $M2\_y$, the sequence of which is variable. The chronological sequence in the at least two sequence modules $M1\_x$, $M2\_y$ should be optimized within the scope of the disclosed method. A first sequence module of the at least two sequence modules $M1\_x$, $M2\_y$ may be $M1\_x$, a second sequence module of the at least two sequence modules $M1\_x$, $M2\_y$ may be $M2\_y$. The first sequence module $M1\_x$ is preferably embodied for a first diffusion weighting and the second sequence module $M2\_y$ is preferably embodied for a second diffusion weighting.

In method step 110, a property comprising a cooling power of the at least one cooling layer 41 is firstly determined for the first gradient coil $51\_x$ and/or the second gradient coil $51\_y$, and/or a feature which is representative of a chronologically preceding use of the gradient coil unit 19 is determined. In method step 120, the determination of a first requirement on the first gradient coil $51\_x$ takes place for the first sequence module $M1\_x$. In method step 130, the determination of a second requirement on the second gradient coil $51\_y$ takes place for the second sequence module $M2\_y$. The method steps 110, 120, 130 can be carried out in any chronological sequence and/or at least partially simultaneously. In method step 140, the chronological sequence in at least the first sequence module and the second sequence module is optimized by taking into account the property, the first requirement and the second requirement.

The original MR control sequence typically comprises a plurality of sequence modules. The optimization can be restricted to particular sequence modules of the plurality of sequence modules as a function of the examination to be carried out. Therefore, according to one aspect of the method, a selection of the first sequence module $M1\_x$ and the second sequence module $M2\_y$ from a plurality of sequence modules can optionally be carried out in method step 115. Method step 115 is typically carried out before method steps 120 and 130 in terms of time. In addition, in a further method step 150 the magnetic resonance device 11 can optionally be controlled by means of the optimized MR control sequence.

If the property comprises the cooling power of the cooling layer 41 for the first gradient coil $51\_x$ and/or the second gradient coil $51\_y$, this can take place on the basis of one of the following features:

r. a positioning of the first gradient coil $51\_x$ and the second gradient coil $51\_y$ relative to one another s. a positioning of the first gradient coil $51\_x$ relative to the cooling layer 41 t. a positioning of the second gradient coil $51\_y$ relative to the cooling layer 41.

If the property comprises the feature which is representative of a chronologically preceding use of the gradient coil unit 19, the feature can be embodied as a temperature of at least one component included in the magnetic resonance device 11. Here the component can comprise one of the following components: first gradient coil $51\_x$ and/or second gradient coil $51\_y$, a gradient amplifier, a gradient cable, a temperature medium of the cooling layer 41. The gradient amplifier can be a gradient amplifier assigned to the first gradient coil and/or the second gradient coil. The gradient cable can be a gradient cable assigned to the first gradient coil and/or the second gradient coil. If the property comprises the feature which is representative of a chronologically preceding use of the gradient coil unit 19, the detection of the property can be a provision of the MR control sequence finally utilized by the magnetic resonance device 11. In particular, the property can comprise the feature which is representative of a chronologically preceding use of the first gradient coil $51\_x$ and/or the second gradient coil $51\_y$ of the gradient coil unit 19. The property can additionally comprise a heat output of the first gradient coil $51\_x$ and/or the second gradient coil $51\_y$.

If the property comprises the cooling power of the cooling layer 41, the optimization can take place so that the gradient coil of the first gradient coil 51_*x* and the second gradient coil 51_*y*, for which the cooling power of the cooling layer 41 is less, is controlled with less intensity than the gradient coil of the first and the second gradient coil 51, 51_*y* for which the cooling power of the at least one cooling layer 41 is higher. The first gradient coil 51_*x* and the second gradient coil 51_*y* are described by a time constant, which time constant is greater than a duration of the first sequence module M1_*x* and/or the second sequence module M2_*y*.

FIG. 3 shows a schematic representation of a gradient coil unit 19. The gradient coil unit 19 is subdivided into a primary and secondary part, wherein the secondary part shields the primary part outside of the gradient coil unit 19. In the primary layer the gradient coil unit 19 comprises a first gradient coil 51_*x*_pri, which is embodied to generate a magnetic field gradient in the x-direction. In the primary layer the gradient coil unit 19 comprises a second gradient coil 51_*y*_pri, which is embodied to generate a magnetic field gradient in the y-direction. In the primary layer the gradient coil unit 19 comprises a third gradient coil 51_*z*_pri, which is embodied to generate a magnetic field gradient in the z-direction. In the primary layer the gradient coil unit 19 comprises a first cooling layer 41_*pri*. In the secondary layer the gradient coil unit 19 comprises a first gradient coil 51_*x*_sek, which is embodied to shield a magnetic field gradient generated by the first gradient coil 51_*x*_pri. In the secondary layer the gradient coil unit 19 comprises a second gradient coil 51_*y*_sek, which is embodied to shield a magnetic field gradient generated by the second gradient coil 51_*y*_pri. In the secondary layer the gradient coil unit 19 comprises a third gradient coil 51_*z*_sek which is embodied to shield a magnetic field gradient generated by the third gradient coil 51_*z*_pri. In the secondary layer the gradient coil unit 19 comprises a second cooling layer 41_*sek*. The arrangement of the individual coils and layers is shown schematically in Figure.

Figure 4:
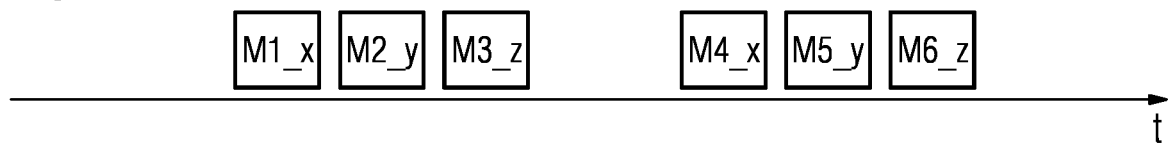
FIG. 4 illustrates an original chronological sequence in an MR control sequence in accordance with aspects of the disclosure.

FIG. 4 shows a schematic representation of an original chronological sequence in an MR control sequence. The original chronological sequence in the sequence modules is shown as a function of time t. The indices of the sequence modules refer to the direction in which the sequence module has a gradient pulse with the largest amplitude and/or largest increase in rate and/or largest drop in rate and/or longest duration. The sequence module M1_*x* provides for instance the control of the first gradient coil 51_*x*_pri, for instance by the sequence module M1_*x* comprising a diffusion weighting in the x-direction. The sequence module M3_*z* provides for instance for the control of the third gradient coil 51_*z*_pri, for instance by the sequence module M3_*z* comprising a diffusion weighting in the z-direction.

Figure 5:
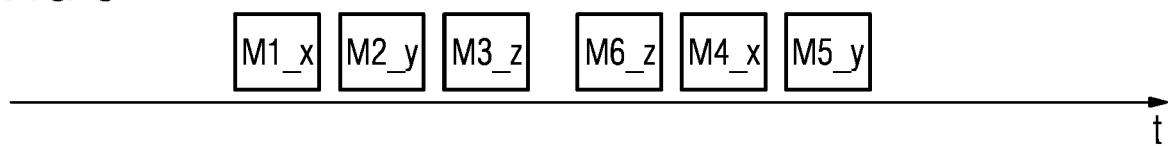
FIG. 5 illustrates a chronological sequence in an MR control sequence which is optimized according to a first aspect of the disclosure.

FIG. 5 shows a schematic representation of a chronological sequence in the original MR control sequence, shown in FIG. 4 and optimized according to a first aspect, for the gradient coil unit 19 shown in FIG. 3. With the disclosed optimization, the arrangement of the cooling layers 41_*pri*, 41_*sek*, the first gradient coils 51_*x*_pri, 51_*x*_sek, the second gradient coils 51_*y*_pri, 51_*y*_sek and the third gradient coils 51_*z*_pri, 51_*z*_sek relative to one another has been take into account. In particular, the distance between the first gradient coil 51_*x*_pri, the second gradient coil 51_*y*_pri and the third gradient coil 51_*z*_pri relative to the cooling position 41_*pri* has been taken into account in the primary layer. As a measure of the cooling power for instance, this relative positioning has been taken into account as a property. The gradient coil unit 19 according to FIG. 3 provides that in order to generate a magnetic field gradient in the z-direction, in the primary layer the third gradient coil 51_*z*_pri is adjacent to the cooling layer 41_*pri* and in the secondary layer the third gradient coil 51_*z*_sek is adjacent to the cooling layer 41_*sek*. The gradient coil unit for the third gradient coil 51_*z*_pri, 51_*z*_sek then has the highest cooling power. The optimized chronological sequence then provides for a shortened pause for the sequence modules M3_*z*, M6_*z* with a particularly significant stress on the third gradient coil 51_*z*_pri, 51_*z*_sek. The sequence module M6_*z* can be output for instance in a pause, provided according to the original chronological sequence, between the sequence modules M3_*z* and M4_*x*. This enables a shortening of the duration for utilizing the optimized MR control sequence. Alternatively, the optimized chronological sequence can provide a sequence in the sequence module, as specified in FIG. 5, wherein the pause between M3_*z* and M6_*z* corresponds to the pause between M3_*z* and M4_*x* of the original chronological sequence. This enables a uniform load on the individual gradient coils. Similarly, this enables a lengthening of the pause for the first gradient coil 51_*x*_pri, 51_*x*_sek and the second gradient coil 51_*y*_pri, 51_*y*_sek, for which a lower cooling power is provided on account of the spatial arrangement of the cooling layers 41_*pri*, 41_*sek*. In this way the cooling power of the cooling layers 41_*pri*, 41_*sek* is utilized particularly well.

Figure 6:
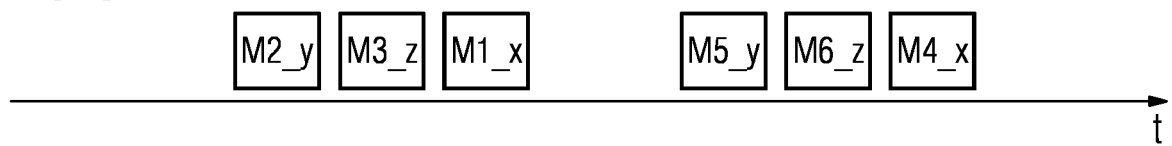
FIG. 6 illustrates shows a schematic representation of a chronological sequence in an MR control sequence which is optimized according to a second aspect of the disclosure.

FIG. 6 shows a schematic representation of a chronological sequence in the original MR control sequence shown in FIG. 4 and optimized according to a second aspect, wherein during optimization a feature which is representative of a chronologically preceding use of the gradient coil unit 19 has been taken into account. In the example shown, the preceding use represents the utilization of an MR control sequence, which has stressed the first gradient coil 51_*x*_pri, 51_*x*_sek in the primary and secondary layer particularly significantly. The preceding use can be determined for instance by means of a temperature measurement on the gradient coil 51_*x*_pri and/or the gradient amplifier assigned to the gradient coil 51_*x*_pri and/or a gradient cable connected to the gradient coil 51_*x*_pri. Alternatively, the property can be provided to the method according to the second aspect as information relating to a previously utilized MR control sequence, especially particular parameters of the same. The previously utilized MR control sequence can be a TSE DIXON with read-out gradient in the x-direction, for instance.

The chronological sequence which is optimized according to the second aspect subsequently provides a late control of the first gradient coil 51_*x*_pri compared with the original sequence. This enables a longer pause between the chronologically preceding use of the gradient coil unit 19 and the control of the first gradient coil 51_*x*_pri, as a result of which this can cool down over a longer period of time. This enables a chronologically more constant temperature, in particular of the first gradient coil 51_*x*_pri, than the original chronological sequence.

The optimization according to the second aspect preferably additionally takes into account the geometric structure of the gradient coil unit 19 and a cooling power for at least one gradient coil. The optimization can therefore take into account for instance that according to FIG. 4 the third gradient coil 51_*z*_pri can be loaded more significantly for a gradient coil unit 19 than the first gradient coil 51_*x*_pri and/or the second gradient coil 51_*y*_pri. As a result, the chronological sequence, which is optimized according to the second aspect enables, for instance, a higher diffusion weighting in the z-direction than in the y-direction.

Figure 7:
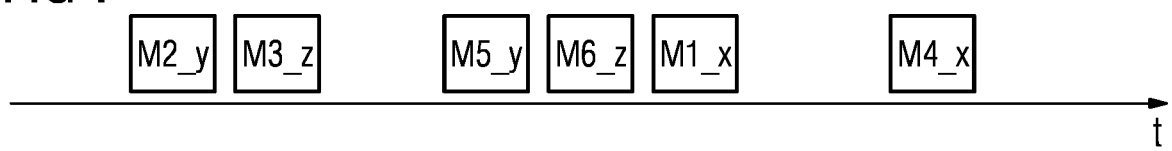
FIG. 7 illustrates shows a schematic representation of a chronological sequence in an MR control sequence which is optimized according to a third aspect of the disclosure.

FIG. 7 shows a schematic representation of a chronological sequence, which is optimized according to a third aspect, in the original MR control sequence shown in FIG. 4, wherein during optimization, a feature which is representative of a chronologically preceding use of the gradient coil unit 19 has been taken into account. This optimized chronological sequence is an alternative to the second aspect shown in FIG. 6. This optimized chronological sequence provides that the sequence modules are arranged so that the first gradient coil 51_x_pri is finally controlled. The third aspect is particularly advantageous with a particularly significant load on the first gradient coil 51_x_pri during the preceding use of the gradient coil unit 19. Similarly to the second aspect, the optimization according to the third aspect preferably additionally takes into account the geometric structure of the gradient coil unit 19 and a cooling power for at least one gradient coil.

Although the disclosure illustrates and describes in detail using the preferred exemplary aspects, the disclosure is not limited by the disclosed examples, and a person skilled in the art can derive other variations therefrom without departing from the scope of the disclosure.

What is claimed is:

1. A method for optimizing a chronological sequence in a magnetic resonance (MR) control sequence according to which a magnetic resonator having a gradient coil unit including a first gradient coil, a second gradient coil, and at least one cooling layer is controllable, wherein the MR control sequence has a first sequence module configured to control the first gradient coil and a second sequence module configured to control the second gradient coil, the method comprising:
    detecting a property including:
        a cooling power of the at least one cooling layer for the first gradient coil and/or the second gradient coil; and/or
        a feature which is representative of a chronologically preceding use of the gradient coil unit;
    determining a first requirement of the first sequence module on the first gradient coil;
    determining a second requirement of the second sequence module on the second gradient coil; and
    optimizing the chronological sequence in at least the first sequence module and the second sequence module by taking into account the property, the first requirement, and the second requirement.

2. The method as claimed in claim 1, wherein the property comprises the cooling power of the at least one cooling layer for the first gradient coil and/or the second gradient coil as in at least one of the following features:
    a positioning of the first gradient coil and the second gradient coil relative to one another;
    a positioning of the first gradient coil relative to the at least one cooling layer; and
    a positioning of the second gradient coil relative to the at least one cooling layer.

3. The method as claimed in claim 1, wherein the property comprises the feature which is representative of the chronologically preceding use of the gradient coil unit and is embodied as a temperature of at least one component included in the magnetic resonator.

4. The method as claimed in claim 3, wherein the at least one component comprises one of the following components:
    the first and/or the second gradient coil;
    a gradient amplifier for at least the first and/or second gradient coil;
    a gradient cable; and
    a temperature medium of the at least one cooling layer.

5. The method as claimed in claim 1, wherein the property comprises the feature which is representative of the chronologically preceding use of the gradient coil unit and the detection of the property comprises providing the MR control sequence last used by the magnetic resonator.

6. The method as claimed in claim 1, wherein the property comprises the feature which is representative of the chronologically preceding use of the first gradient coil and/or the second gradient coil of the gradient coil unit.

7. The method as claimed in claim 1, wherein the property comprises the cooling power of the at least one cooling layer and the optimization takes place so that the gradient coil of the first and the second gradient coil for which the cooling power of the at least one cooling layer is lower, is controlled with less intensity than the gradient coil of the first and the second gradient coil for which the cooling power of the at least one cooling layer is higher.

8. The method as claimed in claim 1, wherein the first gradient coil is embodied to generate a magnetic field gradient in a first direction, the second gradient coil is embodied to generate a magnetic field gradient in a second direction, and the first direction differs from the second direction.

9. The method as claimed in claim 1, wherein the first gradient coil and/or the second gradient coil has a time constant which is greater than a duration of the first sequence module and/or the second sequence module.

10. The method as claimed in claim 1, wherein the first sequence module is embodied for a first diffusion weighting and the second sequence module is embodied for a second diffusion weighting.

11. The method as claimed in claim 1, wherein the property additionally comprises a heat output of the first gradient coil and/or the second gradient coil.

12. A magnetic resonator, comprising:
    a gradient coil unit comprising a first gradient coil, a second gradient coil, and at least one cooling layer; and
    a controller comprising an optimizer configured to optimize a chronological sequence in an MR control sequence as claimed in claim 1.

13. A non-transitory electronically readable computer program product having stored thereon a program that, when executed by an optimizer, cause the optimizer to carry out the method for optimizing a chronological sequence in an MR control sequence as claimed in claim 1.

* * * * *